United States Patent [19]

Ralston et al.

[11] Patent Number: 4,865,923
[45] Date of Patent: Sep. 12, 1989

[54] SELECTIVE INTERMIXING OF LAYERED STRUCTURES COMPOSED OF THIN SOLID FILMS

[75] Inventors: John D. Ralston, Ithaca, N.Y.; Anthony L. Moretti, Naperville; Ravinder K. Jain, Warrenville, both of Ill.

[73] Assignee: Amoco Corporation, Chicago, Ill.

[21] Appl. No.: 164,531

[22] Filed: Mar. 7, 1988

Related U.S. Application Data

[63] Continuation-in-part of Ser. No. 916,818, Oct. 9, 1986, Pat. No. 4,731,338.

[51] Int. Cl.$^4$ .................. H01L 21/265; H01L 21/203
[52] U.S. Cl. ............................ 428/620; 148/DIG. 84; 427/38; 427/53.1; 437/19; 437/22; 437/133
[58] Field of Search .................. 428/620; 437/133, 22, 437/19; 148/DIG. 84; 427/38, 53.1

[56] References Cited

U.S. PATENT DOCUMENTS

| | | | |
|---|---|---|---|
| 4,071,383 | 1/1983 | Nagata et al. | 148/DIG. 84 |
| 4,318,752 | 3/1982 | Tien | 148/DIG. 84 |
| 4,374,678 | 2/1983 | Castro | 437/936 |
| 4,639,275 | 1/1987 | Holonyak, Jr. | 437/133 |
| 4,654,090 | 3/1987 | Burnham et al. | 148/DIG. 84 |
| 4,654,099 | 3/1987 | Burnham et al. | 148/1.5 |
| 4,670,063 | 1/1987 | Schachameyer et al. | 427/53.1 |
| 4,689,646 | 8/1987 | Matsumoto et al. | 357/22 |
| 4,719,123 | 1/1988 | Haku et al. | 427/53.1 |
| 4,722,907 | 2/1988 | Weil et al. | 437/133 |
| 4,727,555 | 2/1988 | Burnham et al. | 437/247 |

FOREIGN PATENT DOCUMENTS 8203946  11/1982  PCT Int'l Appl.

OTHER PUBLICATIONS

Kurz et al., "Beam–Solid Interactions and Phase Transformations," Material Research Symposium Proceedings, vol. 51, pp. 184–189, 1986.
Ralston et al., "Intermixing of $Al_xGa_{1-x}As$ Superlattices by Pulsed Laser Irradiation," Appl. Phys. Lett. 50(25), pp. 1817–1819, Jun. 1987.

Primary Examiner—Upendra Roy
Attorney, Agent, or Firm—Bruce A. Walker; William H. Magidson; Ralph C. Medhurst

[57] ABSTRACT

Synthetic layered structures, which may be semiconductor structures, are modified, both laterally and vertically, to provide novel electronic, optoelectronic, and optical properties. This is accomplished by selective intermixing of such layered structures through selective irradiation with laser beam or electron beam energy sources to effect interaction between neighboring regions, to a degree dependent on the energy density, while avoiding physical damage to the layered structures.

28 Claims, 5 Drawing Sheets

SELECTIVE INTERMIXING OF LAYERED STRUCTURES COMPOSED OF THIN SOLID FILMS

BACKGROUND OF THE INVENTION

This application is a continuation in part of U.S. patent application, Ser. No. 916,818, filed Oct. 9, 1986, now U.S. Pat. No. 4,731,338, granted Mar. 15, 1988.

This invention relates generally to synthetic layered structures, composed of two or more thin solid films, and to a method for the selective intermixing of such layered structures by utilizing a laser or electron beam as the energy source.

A particular class of synthetic layered structures of considerable importance is the semiconductor superlattice in which two or more semiconductor materials with different electronic properties are interleaved in thin layers either (1) by depositing sheets of the semiconducting materials in an alternating manner, or (2) by introducing different impurities in an alternating manner into layers of the semiconducting materials. The former is designated as a compositional, or heterostructure, superlattice, and the latter is designated as a doping superlattice. Thus, a compositional superlattice comprises a periodic array consisting of alternating layers of two or more different semiconductors. Each layer has a thickness in the range from a single atomic layer up to several hundred atomic layers. In a compositional superlattice, the two semiconductors are so chosen that their band gaps, i.e., the difference in energy between the valence and conduction bands, differ significantly.

In the literature, a structure composed of two thin films of different semiconductors is called a single heterostructure. A structure composed of a semiconductor film of lower band gap sandwiched between two semiconductor layers of larger band gap is referred to as a double heterostructure. When the middle layer is sufficiently thin, the structure is called a single quantum well (SQW). A periodic structure composed of alternating layers of two or more different semiconductors is sometimes also referred to as a multiple-quantum-well (MQW) or a superlattice depending on the thickness of the semiconductor layer with the larger band gap. For the purposes of this invention, the distinction between a superlattice and a MQW is not essential, and thus the term "superlattice" will be used henceforth for the sake of simplicity. As used herein, it is intended that the term "selective intermixing" includes also the case where all regions of a synthetic layered structure are intermixed as well as the case where only a limited portion thereof is intermixed.

Specifically, each layer of the semiconductor having the smaller band gap produces what is referred to as a potential well in either the conduction band or the valence band, or in both. In terms of optical and electronic properties, important distinctions can be made between three different types of semiconductor superlattices, commonly referred as types of I, I', and II, depending on the relative alignment of the conduction and valence bands in the two semiconductors. However, for the purposes of this invention, such distinctions are not essential. Inside each potential well, only certain energy states or levels are available to the confined carriers (electrons in the conduction-band or holes in the valence-band). The values of the energy levels available to the electrons can be selectively controlled by appropriate choice of semiconductor materials and the width of their layers. In this fashion, the electronic and/or optical properties of SQW's, or of compositional or doping superlattices, can be tailored.

It is generally well known in the art that in a semiconductor multilayer structure, the semiconductor with the smaller band gap can be a material such as gallium arsenide (GaAs) and the one with the larger band gap can be a material such as aluminum gallium arsenide ($Al_xGa_{1-x}As$), wherein x represents a variable aluminum mole fraction. Compositional superlattices and SQW's consisting of gallium arsenide and aluminum gallium arsenide are generally grown by metalorganic chemical vapor deposition (MO-CVD), molecular beam epitaxy (MBE), liquid phase epitaxy (LPE), or other suitable deposition techniques. The preferable techniques are generally considered to be the MO-CVD and MBE processes.

Since it is necessary to laterally modify the doping, mobility, band gap and refractive index of the epitaxially grown compound semiconductor layers (such as doping or compositional superlattices) for monolithic integration of all relevant optical components, there has arisen the need to perform selective intermixing of different semiconductor layers, typically of thickness ranging from about 5 A to about 5 microns, comprising device structures such as $GaAs/Al_xGa_{1-x}As$ superlattices and related heterostructures used for optoelectronics. Heretofore, in the prior art, such selective intermixing has been achieved by either localized diffusion or implantation of both donor or acceptor impurities.

In particular, a method is disclosed in U.S. Pat. No. 4,378,255 by which a multilayer, group III-V semiconductor structure can be disordered and shifted up in energy gap into single crystalline form by the expedient of a zinc diffusion. This patent teaches that all, or selected portions, of a multilayer of either gallium arsenide/aluminum arsenide or gallium arsenide/aluminum gallium arsenide can be converted into a single crystal aluminum gallium arsenide having a higher energy gap than that of the original structure by the process of zinc diffusion at low temperature. However, this prior art technique suffers from the disadvantage that substantial intermixing of the superlattice layers requires diffusion times on the order of hours. Furthermore, this prior art technique is unable to obtain such intermixing without the introduction of substantial impurity atom concentration into the superlattice materials.

Another recently reported technique relates to the formation of $Al_xGa_{1-x}As$ alloy on a semi-insulating GaAs substrate by irradiating a two-layer structure of AlAs and GaAs with a high power continuous wave (cw) argon laser. This technique was reported by N. V. Joshi and J. Lehman in "Formation of $Al_xGa_{1-x}As$ Alloy on the Semi-insulating GaAs Substrate by Laser Beam Interaction", Materials Research Society Symposia Proceedings, Vol. 51, pp. 185–189 (1986). However, the reported quality of the alloyed material obtained by this method, based on a stationary or quasi-stationary continuous wave beam, appears to be inferior and often leads to destruction of the material. No mention is made in this report of the use of pulsed or of rapidly scanned laser or electron beams with dwell times of a fraction of a second to grow alloys or to intermix relatively complex structures to obtain intermixed materials of high quality or final composite structures of high complexity.

Another recent development is reported in U.S. Pat. No. 4,654,090 wherein selected areas of a semiconductor structure are converted into a disordered alloy by thermal treatment in a protected environment. The structure is heated to a temperature near the melting point, where rapid thermal disordering will occur (about 750°–850° C.), and then scanned with a laser beam, as, for example, from a semiconductor laser device. The protected environment may be a closed vessel, for avoiding loss of vapor due to the high temperature, or may be a covering, or shroud, to accomplish the same purpose.

It would therefore be desirable to provide an improved process for more rapid and selective intermixing of multilayered materials whereby superior electronic and optical properties are obtained without the necessity of introducing impurity atoms into the material or heating the bulk material to very high temperatures. Moreover, in contrast to the work of Joshi and Lehman, it would be desirable to provide a new method that would be applicable to the intermixing of complex multilayered structures such as layer heterostructures and superlattices. Such an improvement would enhance the entire field of integrated optics/ optical signal processing. Such improvements are achieved in the present invention by utilizing pulsed or rapidly scanned directed energy sources such as those derived from suitably chosen laser beams or electron beams for intermixing of multilayered structures.

SUMMARY OF THE INVENTION

Accordingly, it is a general object of the present invention to provide an improved process for selective intermixing of layered structures, such that the method is relatively simple and yet overcomes the disadvantages of the prior art.

One object of the present invention is to provide a process for selective intermixing of layered structures by irradiating with a pulsed or rapidly scanned laser beam or electron beam.

Another object of the present invention is to provide a process for selective intermixing of multilayered semiconductor structures such as varied heterostructures and superlattices by irradiating with a single pulse from a suitable laser or electron beam.

It is still another object of the present invention to provide a process for selective intermixing of multilayered semiconductor structures by irradiating with a series of pulses from a suitable laser or electron beam in order to increase the degree of intermixing.

In still another object of the present invention there is provided a method for selective intermixing of GaAs-/$Al_xGa_{1-x}As$ multilayers by irradiating with either a single pulse or a series of pulses from a frequency-doubled Nd:YAG laser or excimer laser.

A further object of this invention is the affording of novel structures, derived from existing thin solid films, by selective intermixing in accordance with any of the process techniques set forth herein.

It is yet another object of the present invention to provide new integrated structures comprising layers of thin solid films, selectively intermixed by irradiation with a selected energy source, which contain laterally and/or vertically isolated regions exhibiting physical, optical and/or electronic properties which differ from those of the unmixed regions. These and other objects and advantages of the present invention will become more fully apparent from the following detailed description, when read in conjunction with the accompanying drawings.

DESCRIPTION OF THE INVENTION

Figure 1:
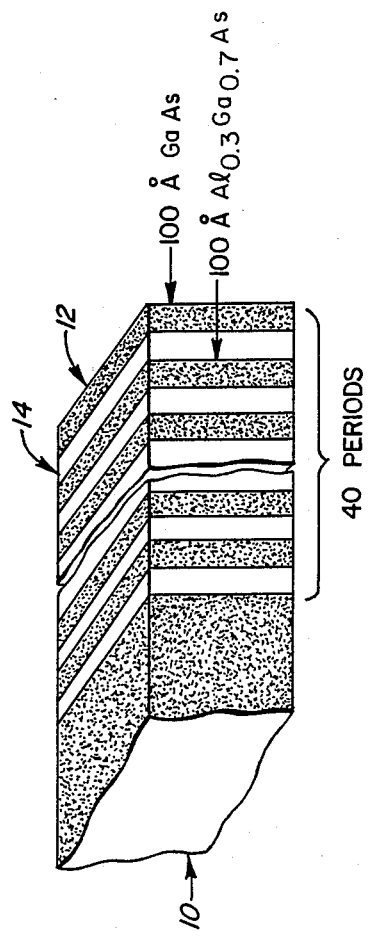
FIGS. 1 and 2 show enlarged, side elevational views of two superlattice samples for use in the present invention.

In the process of this invention multilayered structures are selectively intermixed by irradiation with a directed energy source. Such structures of this invention may include doping superlattices or compositional superlattices. Such structures may consist of as few as two layers, with, for example, one layer having a lower band gap and the second layer having a larger band gap. Similarly, such structures may consist of either single or double heterostructures. More generally, such layered structures comprise many layers, which may include alternating quantum-well and barrier regions. Each layer of the structure should have a thickness ranging from about 3 to about 50,000 A and thus constituting up to several hundred atomic layers. The layer thickness should preferably be within the range from about 5 to about 2,000 A, more preferably from about 5 to about 500 A. Doping superlattices may also be employed and, where specific effects may be desired, other types of layers may be interspersed as well. The total thickness of the layered structure, which may be a semiconductor structure, may be as great as from about 5 to about 10 microns, thus ranging from about 50,000 to about 100,000 A.

As used herein, the term "semiconductor" is intended to include insulators, which, in many cases, are essentially semiconductors of large band gap and low doping density.

In the process of this invention, the intermixing treatment may be conducted at any desired temperature, selected primarily for convenience in operation. Generally preferred temperatures include ambient temperature, while permissible temperatures range down to 0° C. and lower or up to several hundred degrees C although a generally acceptable range extends from about 0° C. to about 50° C. Pressure is not a critical variable and placement of the sample in an ambient environment is generally suitable.

In the process of this invention, a region of the multilayered structure, which may be a surface layer, is irradiated with an energy source which is adapted to provide an energy density which is sufficient to effect the desired intermixing between alternating layers. It has been found that this can be readily accomplished, with surprising ease and effectiveness, by employing a pulsed laser beam. Similar irradiation with a rapidly scanned laser beam, a pulsed or rapidly scanned electron beam, or a combination of such beams may be employed. One preferred energy source comprises pulsed excimer laser beams, particularly the KrF laser beam, having a wavelength of 248 nanometers.

The energy density must, of course, be above the threshhold level for intermixing and should be selected to avoid significant damage to the multilayered structure. The desired effect is an intermixing which provides selected lateral and/or vertical regions which exhibit optical, optoelectronic, and/or electronic properties which are different from those of the original semiconductor structure. In some instances this will comprise the conversion of a compositional superlattice to an alloy structure. One proposed mechanism for this result, by which we do not wish to be bound and mention only for discussion purposes, would involve a selective melting of portions of the structure, followed by recrystallization, thus implying that very high temperatures are achieved. If this be so, then it is apparent that the existence of such high temperatures must be limited to periods of short duration to avoid possible physical damage to the structure.

In the practice of this invention, it has been observed that in many instances a single pulse of a pulsed laser beam is sufficient to accomplish the desired intermixing. More than one pulse may also be used.

In optimizing the process of this invention with respect to the degree of intermixing, a heated sample mount may be employed to minimize thermal gradients within the multilayered structure and substantially reduce residual lattice damage and strain.

From the foregoing description, it can be seen that the present invention provides a novel and improved process for selective intermixing of superlattice layers by irradiating with as little as a single pulse from a laser. Further, the irradiation can be with multiple laser pulses or other combinations of rapidly scanned laser and electron beam sources, so as to increase the degree of intermixing. This process should also be applicable to a wide range of other layered structures including, but not limited to, metallic superlattices and semiconductor superlattices in different crystal systems.

Figure 2:
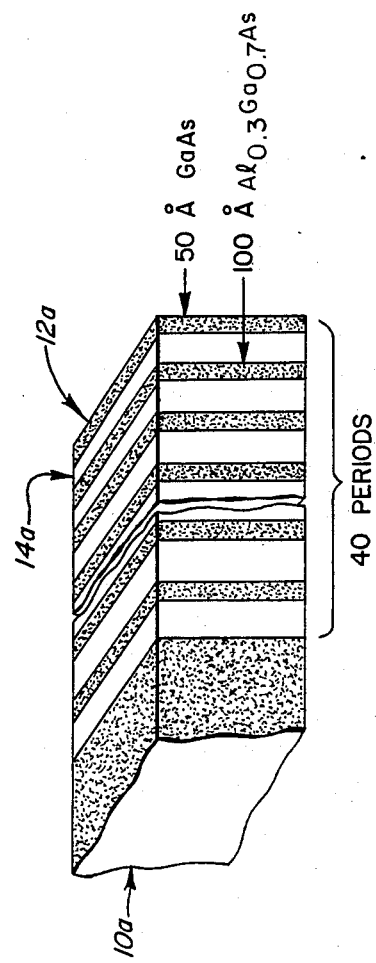

In the drawings, FIG. 1 represents a multilayer structure 10 composed of separate layers of thin solid films, referred to as a superlattice, comprised of 40 periods. Each period consists of a quantum-well layer 12 and a barrier layer 14. In the superlattice 10, each quantum-well layer 12 has a thickness of approximately 100 A and each barrier layer 14 has a thickness of approximately 100 A. The quantum-well layers 12 have a smaller band gap and may be formed of a semiconductor material such as gallium arsenide (GaAs). The barrier layers 14 have a larger band gap and may be formed of a semiconductor material such as aluminum gallium arsenide ($Al_xGa_{1-x}As$) with aluminum mole fraction $x=0.3$. The value of $x=0.3$ has been chosen as an illustrative example; other values can also be easily used. FIG. 2 shows another superlattice structure 10a, having 40 periods, with each period consisting of a GaAs quantum-well layer 12a and a $Al_{0.3}Ga_{0.7}As$ barrier layer 14a. Each of the quantum-well layers 12a has a thickness of approximately 50 A, and each of the barrier layers 14a has a thickness of approximately 100 A.

Figure 3:
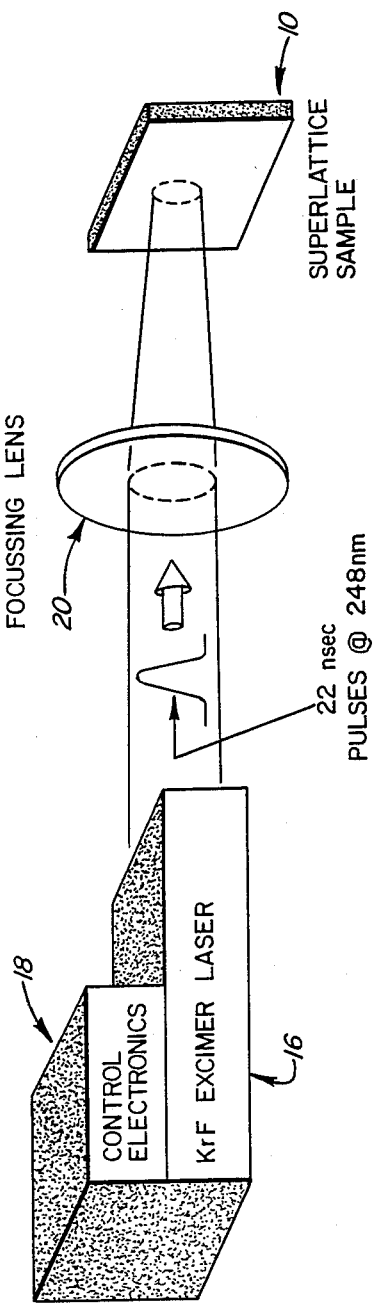
FIG. 3 is a block diagram of an apparatus for selective intermixing of a superlattice, constructed in accordance with the principles of the present invention, and utilizing an excimer laser as the energy source.
Figure 4:
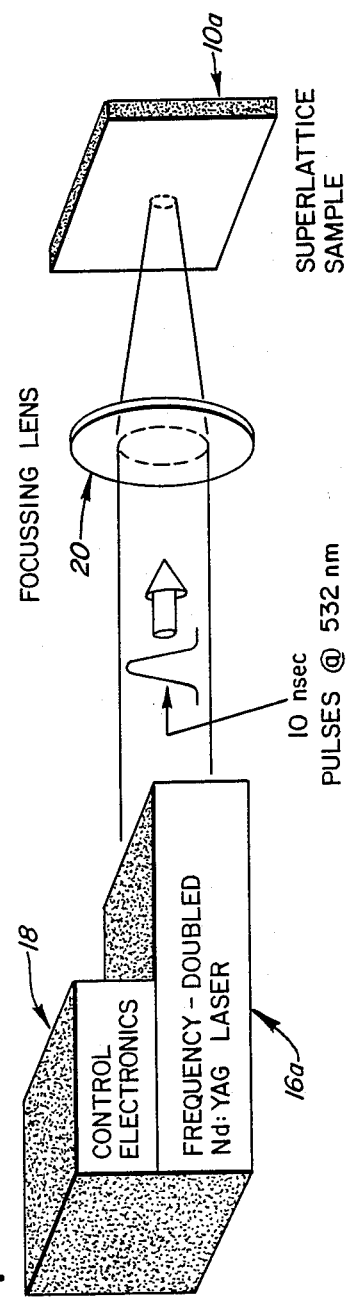
FIG. 4 is a block diagram of an apparatus for selective intermixing of a superlattice, constructed in accordance with the principles of the present invention, and utilizing a frequency-doubled Nd:YAG laser as the energy source.

FIGS. 3 and 4 illustrate apparatus suitable for selective intermixing of a superlattice in accordance with the principles of the present invention. Each apparatus includes an energy source or laser device 16 or 16a which generates a pulsed output with a varying amount of energy per pulse under the control of a power controller 18. The laser device 16 is a commercially available krypton fluoride (KrF) excimer laser operating at a wavelength of approximately 248 nanometers (nm) with a pulse duration of about 22 nsec. The excimer laser is provided with a single-shot or multiple-pulse firing capability. The laser 16a is a commercially available frequency-doubled Q-switched/Nd:YAG (an acronym for neodymium; yttrium, aluminum and garnet) laser having also a single-shot or multiple-pulse firing capability. The Nd:YAG laser operates at a wavelength of approximately 532 nm with a pulse duration of about 10 nsec. The output of the laser device 16 or 16a is directed onto the superlattice sample 10 or 10a via a focusing lens 20. The energy density incident on superlattice sample 10 or 10a is varied by adjusting the laser pulse energy or the focused spot size at the sample surface.

Other available energy sources include a rapidly scanned continuous wave (CW) laser or a pulsed or rapidly scanned electron beam. The laser wavelength and incident power are chosen with respect to the absorption length and thermal diffusion properties of the layered structure so that a sufficient power density is deposited in those regions of the sample which are to be intermixed. The pulse duration of the pulsed energy source or the local dwell time (scan rate) of the rapidly scanned CW energy source are chosen with respect to the stability of the various elements or compounds in the layered structure so as to avoid chemical decomposition of, or mechanical damage to, the structure during the intermixing process. Such times have been determined to be much less than a second for the structures described in the following examples.

The following examples serve to illustrate, without limitation, the process of this invention and the novel, improved semiconductor products made thereby.

EXAMPLE I

A semiconductor superlattice structure sample was selected, consisting of 40 periods of gallium arsenide quantumwell layers, having a thickness of 100 A, and aluminum gallium arsenide ($Al_{0.3}Ga_{0.7}As$) barrier layers, also having a thickness of 100 A, as shown in FIG. 1. The sample was irradiated in selected areas, employing the apparatus of FIG. 3 with a KrF laser at 248 nm wavelength, with a series of 22 ns pulses where the energy density was varied from about 100 to about 900 $mJ/cm^2$.

For energy densities exceeding about 400 $mJ/cm^2$ (in a single 22 ns pulse), visible damage (cratering, probably due to decomposition of the GaAs and $Al_xGa_{1-x}As$ layers) was induced in the sample. For an incident energy density of 220 $mJ/cm^2$, no visible crystal damage resulted. However, the reflective properties of the irradiated region were altered, giving rise to a surface which, although not cratered or roughened, appears slightly different even to the naked eye.

EXAMPLE II

A semiconductor superlattice structure sample was selected, consisting of 40 periods of gallium arsenide quantumwell layers, having a thickness of 50 A, and aluminum gallium arsenide ($Al_{0.3}Ga_{0.7}As$) barrier layers, having a thickness of 100 A, as shown in FIG. 2. The sample was irradiated in selected areas, employing the apparatus of FIG. 4, with a frequency-doubled Nd:YAG laser at 532 nm wavelength, with a series of 10 ns pulses where the energy density was varied from about 50 to about 400 mJ/cm$^2$.

When the laser intermixing was performed with a single pulse of 10 ns duration and an estimated energy density of 400 mJ/cm$^2$ incident on the sample surface, visible damage ("cratering") was induced. However, when an energy density of approximately 50 mJ/cm$^2$ was used there was no visible crystal damage due to the irradiation by a single pulse.

EXAMPLE III

Figure 5:
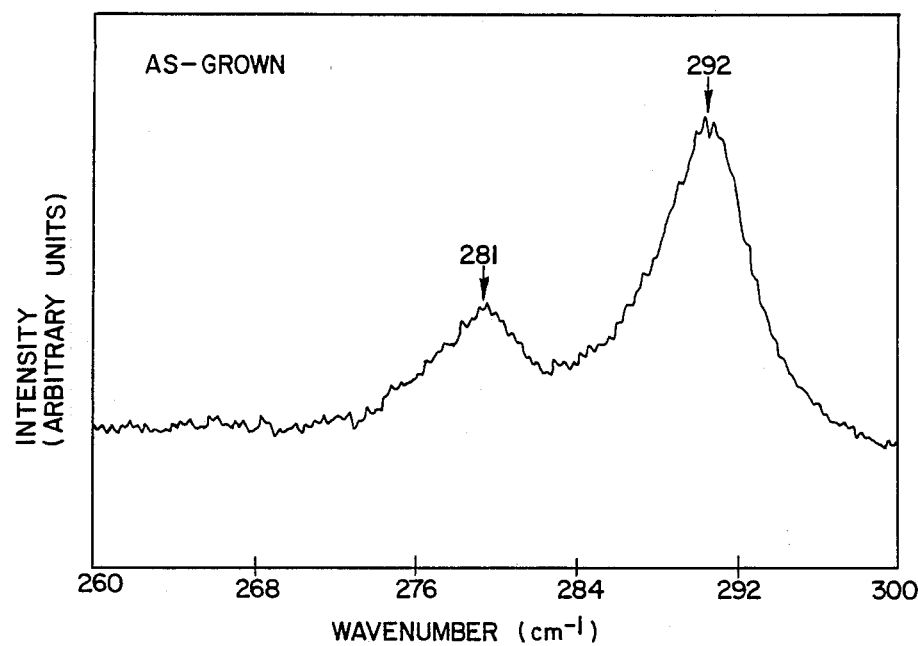
FIGS. 5 and 6 are, respectively, Raman scattering profiles of an as-grown region of the sample in FIG. 1 and a region of the sample which has been irradiated with a single pulse from a KrF excimer laser.
Figure 6:
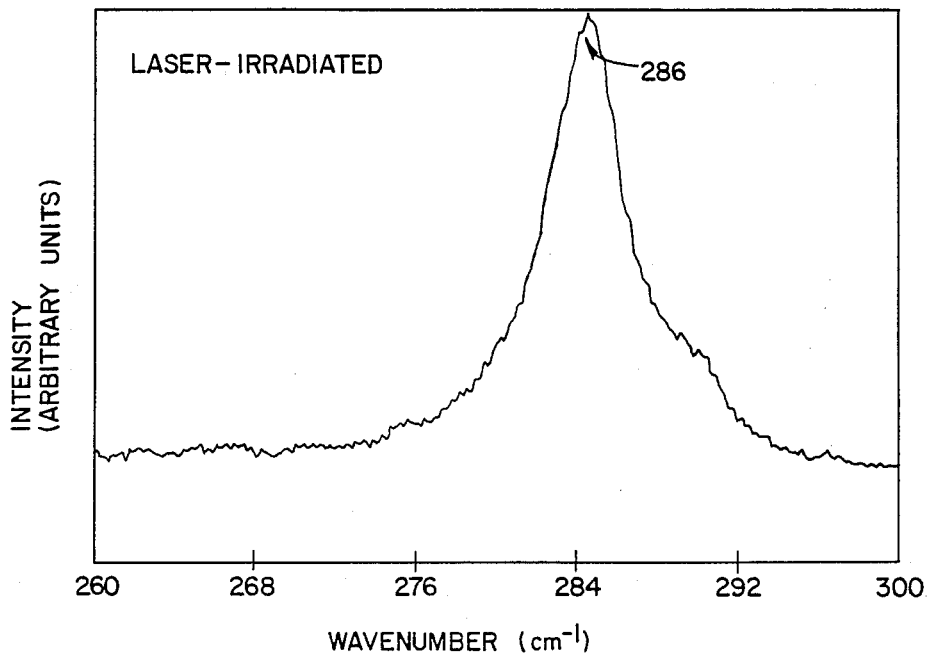

Raman scattering spectra were measured on as-grown and excimer laser-irradiated regions of the sample 10 of FIG. 1 (see Example I) for evaluation of the degree of intermixing produced by the present invention. FIG. 5 shows the Raman spectrum of an as-grown region of the sample. As can be seen, a longitudinal optical (LO) phonon peak appears at a frequency of 292 cm$^{-1}$ due to the pure GaAs layers and a GaAs-like LO phonon peak appears at a frequency of 281 cm$^{-1}$ due to the $Al_{0.3}Ga_{0.7}As$ layers. FIG. 6 presents the Raman spectrum from a region of the same sample which was irradiated by a single excimer laser pulse at an energy density of approximately 200 mJ/cm$^2$. As seen, only a single GaAs-like phonon peak is observed, at a frequency of 286 cm$^{-1}$, corresponding to an intermixed $Al_xGa_{1-x}As$ alloy of the expected median composition where x=0.15. These data indicate that extensive intermixing of the original superlattice layers in the sample has occurred.

EXAMPLE IV

Figure 7:
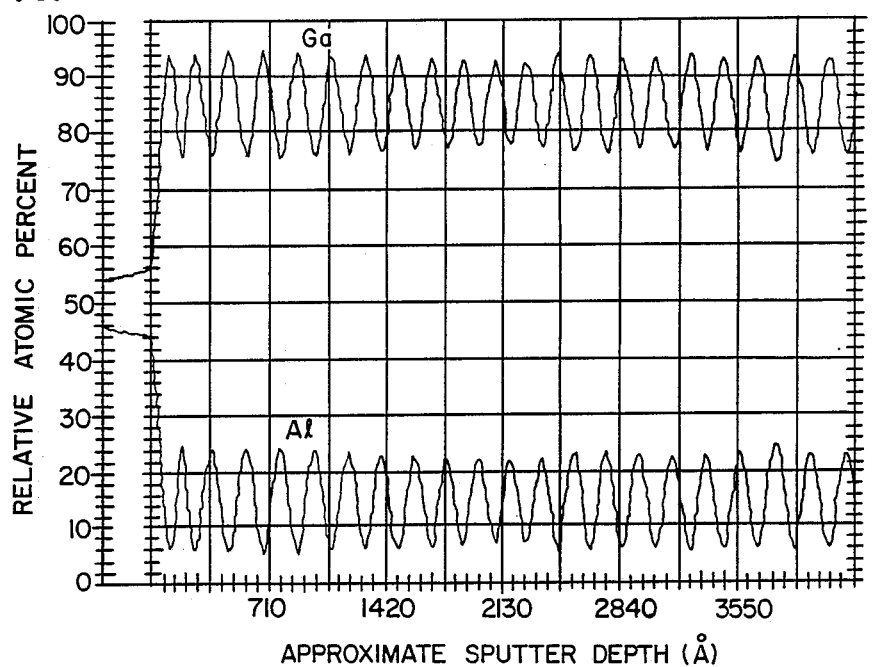
FIGS. 7 and 8 are, respectively, sputter-Auger composition-depth profiles of an as-grown region of the sample in FIG. 1 and a region of the sample which has been irradiated with a single pulse from a KrF excimer laser.
Figure 8:
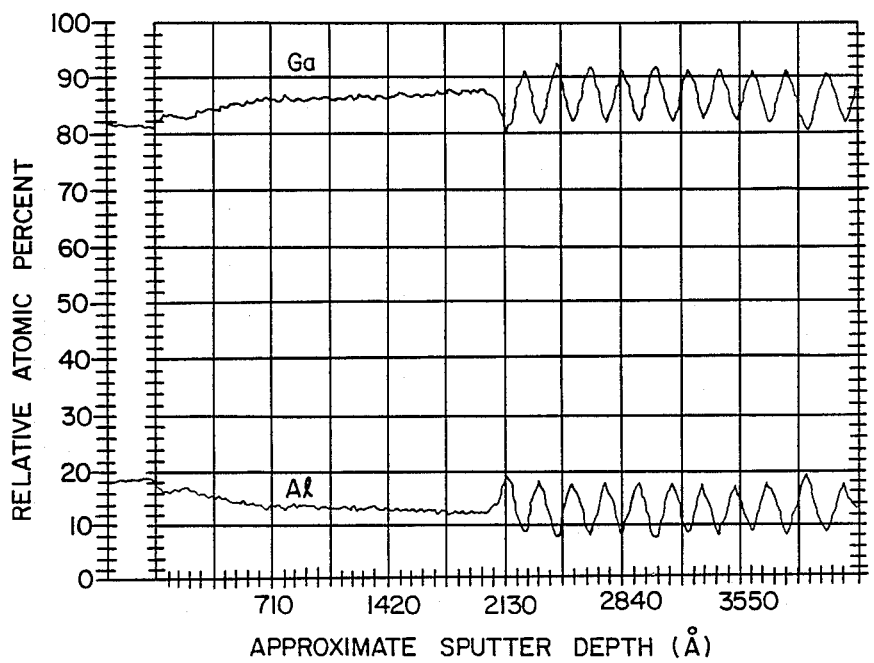

The extent of the interdiffusion of the GaAs layers and the $Al_{0.3}Ga_{0.7}As$ layers was determined by the technique of sputter-Auger profiling, which utilizes a combination of physical sputtering and Auger electron spectroscopy to generate a composition-depth profile of the layered structure. FIG. 7 shows both Ga and Al depth profiles through the first 21 periods (to a depth of about 4200 A) of the as-grown region of the sample 10 in FIG. 1. The effect of laser irradiation (see Example I) is dramatic as shown in FIG. 8. Complete intermixing of the first 11 periods (about 2200 A) occurred. In addition, the transition from the intermixed phase to the unperturbed superlattice structure is observed to be very abrupt. The Al mole fraction of the intermixed alloy is very close to x=0.15, as expected. The above data indicate that the excimer laser irradiation is capable of generating complete intermixing of $GaAs/Al_xGa_{1-x}As$ superlattice layers, with abrupt vertical transition between the intermixed and unmixed regions.

EXAMPLE V

Figure 9:
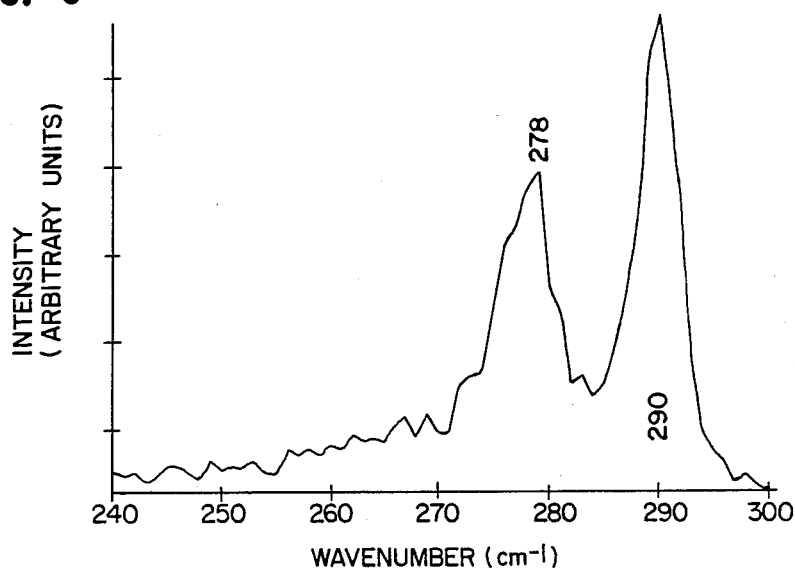
FIGS. 9 and 10 are Raman scattering profiles of an as-grown region of the sample in FIG. 2 and a region of the sample which has been irradiated with five pulses from a frequency-doubled Nd:YAG laser.
Figure 10:
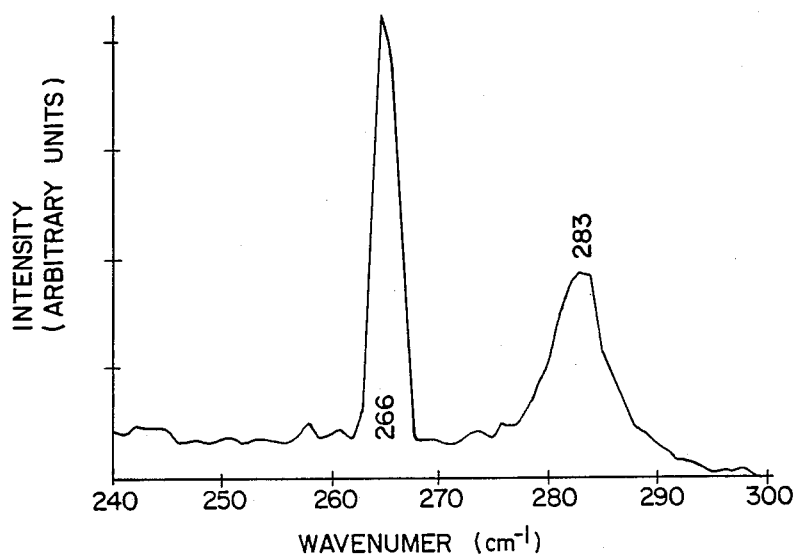

Raman scattering spectra were also measured on asgrown and Nd:YAG laser-irradiated regions (see Example II) of the superlattice sample 10a of FIG. 2. FIG. 9 shows the Raman spectrum of an as-grown region of the sample. Again, LO phonon peaks appear at frequencies of 278 cm$^{-1}$ and 290 cm$^{-1}$, corresponding to the $Al_{0.3}Ga_{0.7}As$ and GaAs layers, respectively. FIG. 10 shows the Raman spectrum from a region of the same sample which was irradiated with five pulses from the Nd:YAG laser 16a of FIG. 3 at an energy density of 120 mJ/cm$^2$ for each pulse. The single relatively narrow LO phonon peak at a frequency of 283 cm$^{-1}$ corresponds to a thoroughly intermixed $Al_xGa_{1-x}As$ alloy of median composition x=0.2, as expected from complete intermixing of the original layered structure. In addition, a prominent symmetry-forbidden transverse optical (TO) phonon peak is observed at a frequency of 266 cm$^{-1}$, indicative of microscopic lattice damage or strain. This may be due to thermal gradients within the volume of the sample irradiated by the Nd:YAG laser, since the output beam from this device has been observed to provide a non-uniform intensity profile. It is believed that microscopic lattice damage and strain can be minimized by ensuring laser beam uniformity and, in addition, by using a heated sample mount to reduce thermal gradients in the sample during irradiation.

EXAMPLE VI

A semiconductor superlattice structure sample was selected, consisting of 30 periods of gallium arsenide layers, having a thickness of 100 A, and aluminum gallium arsenide ($Al_{0.3}Ga_{0.7}As$) layers, having a thickness of 100 A, uniformly doped with silicon to a concentration level of about $6\times10^{17}$ cm$^{-3}$. The laser apparatus of FIG. 4 (Example II) was employed for irradiation with a series of 10 ns pulses where the energy density was varied from about 50 to about 400 mJ/cm$^2$.

At energy densities greater than about 70 mJ/cm$^2$ visible damage at the surface was observed.

A generally preferred embodiment for preparing the product of this invention substantially follows the procedure set forth in Example I. A selected layered semiconductor structure is intermixed by irradiation with a pulsed excimer laser beam, generally providing an energy density ranging from about 100 to about 400 mJ/cm$^2$ at a dwell time of from about 10 to about 30 ns. Both quantum-well and barrier regions may vary in thickness preferably from about 30 to about 150 A. There being no critical requirements as to temperature and pressure parameters, ambient conditions are generally acceptable.

While there has been illustrated and described what is at present considered to be a preferred embodiment for conducting the present invention, it will be understood by those skilled in the art that various changes and modifications may be made, and equivalents may be substituted for elements thereof, without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention include all embodiments falling within the scope of the appended claims.

The process of this invention is ideally suited to provide a novel and direct tailoring of properties of layered thin film structures to provide novel materials for performances not hitherto attainable. A simple, direct selective intermixing for such layered structures, including semiconductor structures, affords both lateral and vertical modification of the doping, mobility, band gap, and refractive index in electronic, optoelectronic, and optical components, including field-effect transistors, lasers, detectors, waveguides and bistable switching elements.

We claim:

1. A selectively intermixed multilayered thin solid film product, characterized as having selected lateral and/or vertical regions wherein adjoining layers which differ, at least in part, in their respective compositions are intermixed, forming composite material features which exhibit distinctively altered optical and/or electronic properties as compared to unmixed layers, there being an abrupt transition from said intermixed features to said unmixed layers, said product being prepared by an intermixing process comprising the steps of:
   (a) affording a multilayered structure having at least two separate thin solid film layers;
   (b) irradiating said multilayered structure over one or more selected regions with an energy source adapted to provide an energy density sufficient to effect selective intermixing between at least some of the thin sold film layers; and
   (c) recovering the selectively intermixed multilayered product.

2. The product of claim 1 wherein the multilayered structure of separate thin solid film layers comprise a plurality of layers of a first solid material interleaved with a plurality of layers of a second solid material.

3. The product of claim 1, wherein the process step (b) employs an energy source selected from the class consisting of pulsed laser beams, rapidly scanned laser beams, pulsed electron beams, rapidly scanned electron beams, and combinations thereof.

4. The product of claim 2 wherein the multilayered structure additionally comprises a plurality of layers of a third solid material.

5. The product of claim 2 wherein the first solid material is GaAs.

6. The product of claim 2 wherein the second solid material is $Al_xGa_{1-x}As$.

7. A selectively intermixed multilayered product, characterized as having selected lateral and/or vertical regions wherein adjoining layers which differ, at least in part, in their respective material properties are intermixed, forming composite material features which exhibit altered optical and/or electronic properties as compared to unmixed layers, there being an abrupt transition from said intermixed features to said unmixed layers, said product being prepared by an intermixing process of comprising the steps of:
   (a) affording a multilayered structure, said structure having at least two layers, each layer having a thickness of at least about 3 Å
   (b) irradiating said multilayered structure over a selected area with an energy source adapted to provide an energy density sufficient to effect selective intermixing between regions of adjacent layers; and
   (c) recovering the selectively intermixed multilayered product.

8. The product of claim 7 wherein the multilayered structure has at least one exposed surface layer and is irradiated over a selected area of said surface layer.

9. The product of claim 7 wherein the respective layers of the multilayered structure are semiconductor layers.

10. The selectively intermixed multilayered product of claim 7, wherein adjacent layers of the multilayered structure comprise different structural compositions.

11. The product of claim 7, wherein each layer of the multilayered structure has a thickness of up to about 50,000 A.

12. The product of claim 7, wherein the intermixed multilayered structure has a thickness of up to 100,000 A.

13. The product of claim 7, wherein the process step (b) employs an energy source selected from the class consisting of pulsed laser beams, rapidly scanned laser beams, pulsed electron beams, rapidly scanned electron beams, and combinations thereof.

14. The selectively intermixed multilayered product of claim 7, wherein the afforded structure of process step (a) includes semiconductor layers that act as quantum-well regions.

15. The selectively intermixed multilayered product of claim 7, wherein the afforded structure of process step (a) includes semiconductor layers that act as barrier regions.

16. The selectively intermixed multilayered product of claim 7, wherein the afforded structure of process step (a) comprises semiconductor layers that act as a alternating quantumwell regions and barrier regions.

17. The selectively intermixed multilayered product of claim 7, wherein the afforded structure comprises units of a two-layer structure, said structure being a single heterostructure.

18. The selectively intermixed multilayered product of claim 7, wherein the afforded structure comprises units of a three-layer structure, said structure being a double heterostructure.

19. The selectively intermixed multilayered product of claim 7, wherein the afforded structure comprises a doping superlattice.

20. The selectively intermixed multilayered product of claim 10, wherein the afforded structure include, as one structural composition, layers of GaAs.

21. The selectively intermixed multilayered product of claim 10, wherein the afforded structure includes, as one structural compositions, layers of $Al_xGa_{1-x}As$.

22. The product of claim 11, wherein each layer of the multilayered structure has a thickness within the range from about 5 to about 2000 Å.

23. The product of claim 12 wherein each layer of the multilayered structure has a thickness within the range from about 5 to about 500 Å.

24. The product of claim 13 wherein the energy source is a pulsed excimer laser beam.

25. The product of claim 13 wherein the energy source comprises a single pulse from a pulsed laser beams.

26. The product of claim 13 wherein the energy source comprises multiple pulses from a pulsed layer beam.

27. The selectively intermixed multilayered product of claim 14, wherein the afforded structure of process (a) includes at least one species of quantum-well region characterized by the presence of impurity atoms.

28. The product of claim 24 wherein the energy source is a pulsed KrF laser beam.

* * * * *

UNITED STATES PATENT AND TRADEMARK OFFICE
CERTIFICATE OF CORRECTION

PATENT NO. : 4,865,923

DATED : September 12, 1989

INVENTOR(S) : Ralston et al

It is certified that error appears in the above-identified patent and that said Letters Patent is hereby corrected as shown below:

Sheet 5 of 5  FIG. 10  At the bottom of figure, "WAVENUMER" should read --WAVENUMBER--

| Column | Line | |
|---|---|---|
| 2 | 9-10 | "($Al_xGa_{l-x}As$)" should read --($Al_xGa_{1-x}As$)-- |
| 2 | 26 | "5 A" should read --5 Å-- |
| 2 | 27 | "$GaAs/Al_xGA_{l-x}As$" should read --$GaAs/Al_xGa_{1-x}As$-- |
| 2 | 52 | "$Al_xGa_{l-x}As$" should read --$Al_xGa_{1-x}As$-- |
| 2 | 56 | "$Al_xGa_{l-x}As$) should read --$Al_xGa_{1-x}As$-- |
| 3 | 52-53 | "$GaAs/Al_xGA_{l-x}As$" should read --$GaAs/Al_xGa_{1-x}As$-- |
| 4 | 47 | "2,000 A" should read --2,000 Å-- |
| 4 | 48 | "500 A" should read --500 Å-- |
| 4 | 54 | "100,000 A" should read --100,000 Å-- |
| 5 | 57 | "100 A" should read --100 Å-- |
| 5 | 59 | "100 A" should read --100 Å-- |
| 5 | 64 | "$Al_xGa_{l-x}As$" should read --$Al_xGa_{1-x}As$-- |
| 6 | 3 | "50 A" should read "--50 Å-- |
| 6 | 4 | "100 A" should read --100 Å-- |

UNITED STATES PATENT AND TRADEMARK OFFICE
CERTIFICATE OF CORRECTION

PATENT NO. : 4,865,923

DATED : September 12, 1989

INVENTOR(S) : Ralston et al

It is certified that error appears in the above-identified patent and that said Letters Patent is hereby corrected as shown below:

| Column | Line | |
|---|---|---|
| 6 | 51 | "quantumwell" should read --quantum-well-- |
| 6 | 51 | "100 A" should read --100 Å-- |
| 6 | 53 | "100 A" should read --100 Å-- |
| 6 | 61 | "$Al_xGa_{l-x}As$" should read --$Al_xGa_{1-x}As$-- |
| 7 | 5 | "quantumwell" should read --quantum-well-- |
| 7 | 5 | "50 A" should read --50 Å-- |
| 7 | 7 | "100 A" should read --100 Å-- |
| 7 | 37 | "$Al_xGa_{l-x}As$" should read --$Al_xGa_{1-x}As$-- |
| 7 | 50 | "4200 A" should read --4200 Å-- |
| 7 | 53 | "2200 A" should read --2200 Å-- |
| 7 | 59-60 | "$GaAs/Al_xGA_{l-x}As$" should read --$GaAs/Al_xGa_{1-x}As$-- |
| 7 | 65 | "asgrown" should read --as-grown-- |
| 8 | 8-9 | "$Al_xGa_{l-x}As$" should read --$Al_xGa_{1-x}As$-- |
| 8 | 27 | "100 A" should read --100 Å-- |
| 8 | 29 | "100 A" should read --100 Å-- |
| 8 | 44 | "150 A" should read --150 Å-- |
| 9 | 54 | "process of comprising" should read --process comprising" |

UNITED STATES PATENT AND TRADEMARK OFFICE
CERTIFICATE OF CORRECTION

PATENT NO. : 4,865,923

DATED : September 12 1989

INVENTOR(S) : Ralston et al

Page 3 of 3

It is certified that error appears in the above-identified patent and that said Letters Patent is hereby corrected as shown below:

| Column | Line | |
|---|---|---|
| 9 | 57 | "3 Å" should read --3 Å;-- |
| 10 | 29 | "quantumwell" should read --quantum-well-- |
| 10 | 42 | "include" should read --includes-- |
| 10 | 46 | "compositions" should read --composition-- |
| 10 | 57 | "beams" should read --beam-- |
| 10 | 59 | "layer" should read --laser-- |
| 10 | 62-63 | "process (a)" should read --process step (a)-- |

Signed and Sealed this

Third Day of March, 1992

*Attest:*

HARRY F. MANBECK, JR.

*Attesting Officer*

*Commissioner of Patents and Trademarks*